United States Patent [19]

Tinder

[11] Patent Number: 4,707,726
[45] Date of Patent: Nov. 17, 1987

[54] HEAT SINK MOUNTING ARRANGEMENT FOR A SEMICONDUCTOR

[75] Inventor: David V. Tinder, Dearborn, Mich.

[73] Assignee: United Technologies Automotive, Inc., Dearborn, Mich.

[21] Appl. No.: 728,647

[22] Filed: Apr. 29, 1985

[51] Int. Cl.[4] .................. H01L 23/02; H01B 7/34; F28F 7/00; H02B 1/10

[52] U.S. Cl. .................. 357/81; 174/15 R; 174/16 HS; 174/17 R; 165/80.1; 165/80.2; 357/74; 357/79; 361/380; 361/381

[58] Field of Search .............. 357/81, 74, 79; 174/16 HS, 15 R, 17 R; 361/380, 381, 386–389; 165/80.1, 80.2

[56] References Cited

U.S. PATENT DOCUMENTS

| | | | |
|---|---|---|---|
| 3,297,916 | 1/1967 | Wright | 357/81 |
| 3,436,603 | 4/1969 | Vogt | 357/81 |
| 3,571,663 | 3/1971 | Hungate | 357/81 |
| 3,624,452 | 11/1971 | Hayward et al. | 357/81 |
| 3,909,679 | 9/1975 | Petri | 357/81 |
| 4,004,528 | 1/1977 | Adams et al. | 112/218 R |
| 4,167,031 | 9/1979 | Patel | 361/388 |
| 4,193,444 | 3/1980 | Boyd et al. | 165/76 |
| 4,204,248 | 5/1980 | Proffit et al. | 361/388 |
| 4,288,839 | 9/1981 | Prager et al. | 357/81 |
| 4,369,485 | 1/1983 | Bell et al. | 361/386 |
| 4,403,102 | 9/1983 | Jordan et al. | 174/16 HS |
| 4,509,839 | 4/1985 | Lavochkin | 357/81 |

OTHER PUBLICATIONS

"New Adhesives Speed Heat Removal" by Dr. E. Frauenglass, Dr. J. Moran and Robert Batson, taken from Circuits Manufacturing, dated Feb. 1984, p. 89 ff.

Primary Examiner—James W. Davie
Assistant Examiner—Georgia Y. Epps
Attorney, Agent, or Firm—Stephen A. Schneeberger

[57] ABSTRACT

An arrangement for mounting a packaged semiconductor with a heat sink includes the heat sink having a channel formed therein with a pair of opposed side walls and utilizes one or more spring beams acting against one side wall of the channel to urge the semiconductor package into good heat transferring relation or engagement with the other side wall. The arrangement is especially suited for use with TO-220 transistor packages and uses an array of spring beam fingers joined by a spine in comb-like fashion to facilitate assembly.

10 Claims, 4 Drawing Figures

HEAT SINK MOUNTING ARRANGEMENT FOR A SEMICONDUCTOR

DESCRIPTION

1. Technical Field

This invention relates to a heat sink mounting arrangement for a semiconductor and more particularly to an arrangement for mounting certain packaged semiconductors, as of the TO-220 type, in secure heat-exchange relation with a heat sink.

2. Background Art

The heat generated by various semiconductors, such as power transistors and the like, must be dissipated through an efficient heat sink in order to maintain an acceptable temperature at the transistor junction. Power transistors are packaged in a variety of geometrical configurations, however, the TO-220 package is representative of one package from which is quite often used. The TO-220 packaging encapsulates the transistor within a relatively thin, rectilinear, molded block or body of electrically non-conductive porting material, such as epoxy or the like. A flat metal mounting tab or plate is also included in and extends from the block to form one side of the package. The semiconductor so packaged is then normally positioned in good heat-exchange relation with a heat sink to dissipate unwated heat. A variety of arrangements have existed for mounting such packaged transistors to heat sinks.

FIGS. 1 and 2 are illustrative of two techniques in accordance with the prior art for mounting a power transistor, as contained in a TO-220 package, to a heat sink. Referring to FIG. 1, there is illustrated a power transistor 110 in a TO-220 package in which the semiconductor is enclosed in an electrically non-conductive block 112 which includes metal tab 114 extending therefrom. Tab 114 typically includes an opening 116 therethrough for mounting the transistor package 110 to a heat sink 120. One electrode of the transistor is typically connected electrically in common with the tab 114. In most applications, the semiconductor package 110 must be electrically insulated from the heat sink 120. Conventionally, this is accomplished by inserting a thin insulating sheet of greased mica or plastic or silicone rubber 122 between the packaged transistor 110 and the heat sink 120, and then bolting the tab 114 of package 110 to the heat sink 120 with an insulating washer or sleeve 124 to keep the heat of screw 126 from electrically shorting to the tab 114. This method requires that a hole be drilled or pierced through the insulating sheet 122 and more importantly, the heat sink 120 to accept the screw 126. Alternatively, the transistor 110 may be mounted to a die-cast heat sink formed with either blind or through-holes and using self-tapping screws and using the same insulating sheet 122 and insulating washer 124.

In another arrangement depicted in FIG. 2, a heat sink 220 may be provided with a pair of spaced through-openings 228 and 229. The opposite legs of a spring clip 230 may then be inserted through the heat sink openings 228, 229 for engagement against the rear surface of the heat sink 220 and thus serving to retain the packaged transistor 210 in heat-transferring engagement with the heat sink 220. Since the clip 230 contacts only the non-conductive block or body 212 of the transistor package 210, no equivalent of the insulating washer 124 of FIG. 1 need be used, but an insulating sheet 222 is still required between the transistor and the heat sink.

Yet another form of heat dissipating assembly for semiconductor devices is disclosed in U.S. Pat. No. 4,167,031 to Patel. In that patent, a semiconductor is mounted to a printed circuit board and is then coupled in heat-transferring relationship with a heat sink structure. However, the arrangement for coupling the transistor to the heat sink is complex and includes a screw extending through the heat sink and into engagement with a metal ferrule which in turn urges a spring into compressive engagement with the semiconductor. A large metal holder member is also provided to surround much of the coupling arrangement.

Still another arrangement for coupling semiconductors to a set of cooling plates is disclosed in U.S. Pat. No. 3,436,603 to Vogt. In that patent, springy, sheet-like cooling plates are arranged as pairs in a stack, the two plates of a pair being formed and sufficiently closely positioned to receive and retain a semiconductor package therebetween in heat-exchange relationship. That structure relies upon an accurate determination of the spacing between adjacent cooling plates and requires assembly of the various cooling plates in the desired array.

One disadvantage of some of the aforementioned methods of mounting power transistors is that they require holes to be formed in the heat sink. Aluminum extrusions are typically the most economical heat sinks, and holes can only be provided using secondary manufacturing operations which add to the cost of the part. The cost of handling several parts for each transistor to be mounted makes the various screwed or bolted assemblies very expensive for high volume production. Moreover, in many compact electronic modules the transistors are mounted to the heat sink only after the transistors have been first soldered into a printed circuit board. It is best to wave-solder the power transistors into the printed circuit board along with all other electronic components to avoid hand soldering operations and to implement functional testing of the complete circuit while all components are accessible for repair. If a conformal coating is required, it can be applied before the transistors are attached to the heat sink. Thus, when the circuit board-mounted transistors are brought together with the heat sink, access for couplings or fasteners may be very limited, and the more parts which are involved, the more awkward the assembly becomes.

DISCLOSURE OF INVENTION

Accordingly, it is a principal object of the invention to provide an improved arrangement for mounting a heat sink to a semiconductor. Included within this object is the provision of a heat sink and semiconductor mounting arrangement which is relatively simple and economical to manufacture and assemble.

In accordance with the invention there is provided an improved arrangement for mounting a semiconductor to a heat sink, in which the heat sink has a channel formed therein, the channel being defined by a pair of opposed side wall surfaces of the heat sink and being open at its front, a packaged semiconductor is positioned within the heat sink channel, and a spring is positioned in the heat sink channel and interposed between one of the pair of side wall surfaces and the semiconductor package in mutually opposed compressive engagement.

The packaged semiconductor is typically a power transistor in a TO-220 package configuration. In most embodiments, the channel formed in the heat sink is of sufficient length to accommodate therealong a plurality of discrete semiconductor packages and one, or several, independently-acting spring beams are preferably associated with each of the transistor packages. In a preferred arrangement, the multiple spring beams associated with multiple transistor packages within a heat sink channel are connected in common at one end of each of the springs in comb-like fashion to facilite handling and assembly. The sizing and spacing of adjacent springs is such that for a predetermined minimum spacing between adjacent transistor packages, no single spring contacts more than one transistor package, while two or three spring beams contact each transistor package. Each spring element is preferably in the form of a convex spring beam and has its opposite ends in engagement with one of the side wall surfaces of the heat sink channel and its mid-portion in engagement with the non-conductive block which encapsulates the semiconductor. The ends of each spring beam may be recurved slightly to facilitate flexure within the heat sink channel. A thin, electrically-insulating material may be disposed between the tab base portion of the packaged semiconductor and the other side wall of the heat sink channel if such insulation is required. The packaged semiconductor is typically preassembled to a printed circuit board prior to mounted assembly with the heat sink.

BEST MODE FOR CARRYING OUT THE INVENTION

Figure 1:
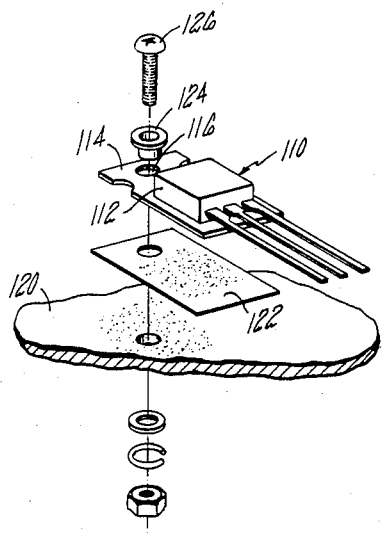
FIG. 1 is an exploded view of one arrangement for mounting a power transistor to a heat sink in accordance with the prior art.
Figure 2:
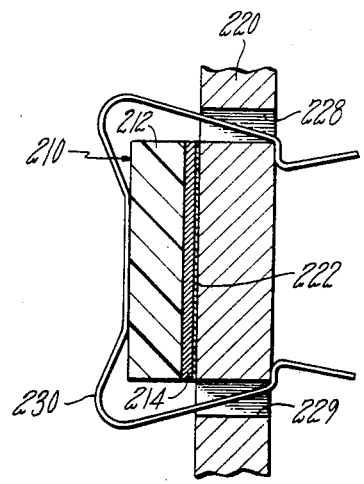
FIG. 2 is a sectional view showing another arrangement for mounting a power transistor to a heat sink in accordance with the prior art.

As previously discussed, FIGS. 1 and 2 illustrate arrangements for mounting semiconductors such as power transistors 110, 210 to respective heat sinks 120, 220 in accordance with the prior art.

Figure 3:
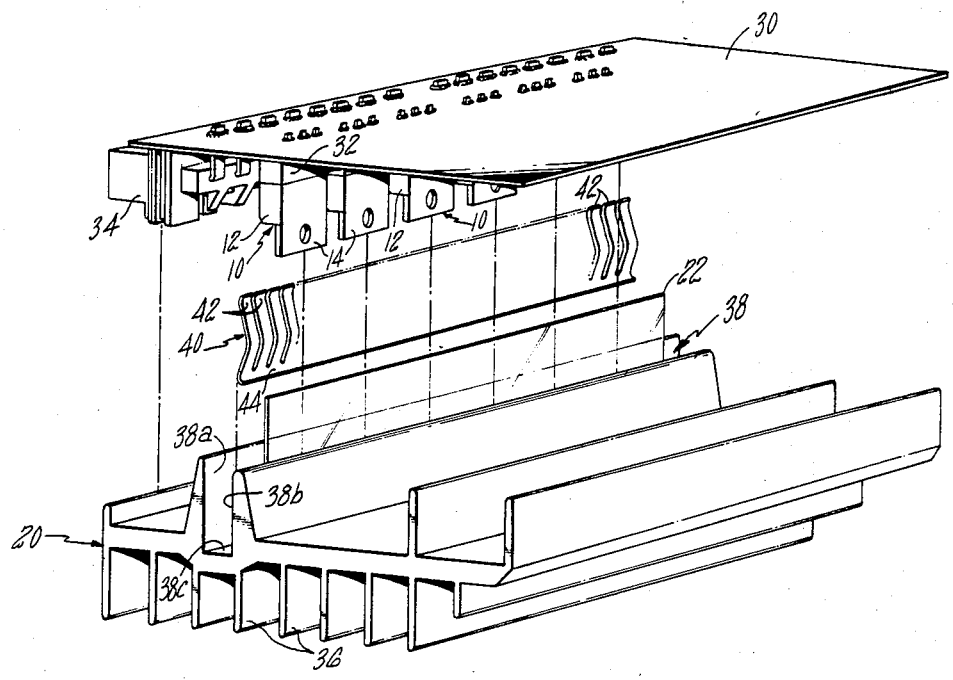
FIG. 3 is an exploded perspective view of the transistor and heat sink mounting arrangement of the present invention.

Referring to the present invention as depicted in FIG. 3, a series of power transistors 10 in TO-220 packages are mounted in a row, or rows, with their metal tabs 14 perpendicular to a printed circuit board 30. An extension 32 of a molded connector 34 (seen more clearly in FIG. 4) provides support for the transistors 10 in this perpendicular position while they are being wave soldered to the circuit board 30. After wave soldering, the electronic circuit employing the transistors 10 is complete and may be functionally tested, clamping temporary heat sinks to the power transistors if appropriate, and may then be repaired and or coated as required.

The heat sink 20 is an aluminum extrusion having a plurality of parallel cooling fins 36. A slot or channel 38 is also formed in the heat sink 20 between a pair of substantially parallel walls 38a and 38b. The channel 38 is open at its front and is closed or blind at its rear, as defined by surface 38c. The channel 38 may be formed in the heat sink 20 by a recess in the major mass of the heat sink, or by a pair of sidewalls extending from that mass as in the illustrated embodiment, or a combination of each. The spacing between opposing walls 38a, 38b of the heat sink channel 38 is controlled to receive the thickness of the transistors 10 and the strip of mica 22 as well as a spring assembly 40 therewithin in snug engagement.

In accordance with the invention, the spring assembly 40 is preferably comprised of a series of spring beams or fingers 42 arranged in parallel, spaced relation and arrayed along a common connecting spine 44 in comb-like fashion. The spine 44 connects each of the spring beams 42 at one end, leaving the other end of the spring beam free. Although the spring beams 42 are illustrated and described in the context of an array joined by spine 44, it will be appreciated that individual spring beams 42 might also be used in certain instances.

The spring assembly 40 is formed of spring steel or the like, and each spring beam 42 is of generally convex shape such that its opposite ends or feet are disposed for engagement with channel wall surface 38a and the mid or knee portion extends inwardly of the channel 38 for engagement with the encapsulating block or body portion 12 of a transistor 10. The opposite ends of each of the spring beams 42 are recurved slightly to facilitate flexure of the spring without "biting" into the wall 38a of channel 38.

By fabricating the spring beams 42 as part of an assembly connected by spine 44, it is possible to cut the assembly to the desired length and to position the springs in the channel 38 as a unit. In the illustrated embodiment, the individual spring beam fingers 42 have a width of approximately 3 millimeters and are spaced from one another by approximately 0.7 mm. Their length from one end to the other is approximately 18 mm with the depth of the convex knee being approximately 2.6 mm. Each of the packaged transistors 10 has a width of approximately 9 mm and are spaced laterally approximately 3 mm from one another such that two or three spring beams 42 may engage a particular transistor 10. However, with such dimensioning of the spring beams 42 and the transistor 10, an individual spring beam 42 will not normally engage a pair of adjacent transistors 10 and certainly no single spring beam 42 is required to provide the major retentive force for an adjacent pair of transistors 10. Such arrangement accommodates some variation in the size and thickness of adjacent transistors 10.

Figure 4:
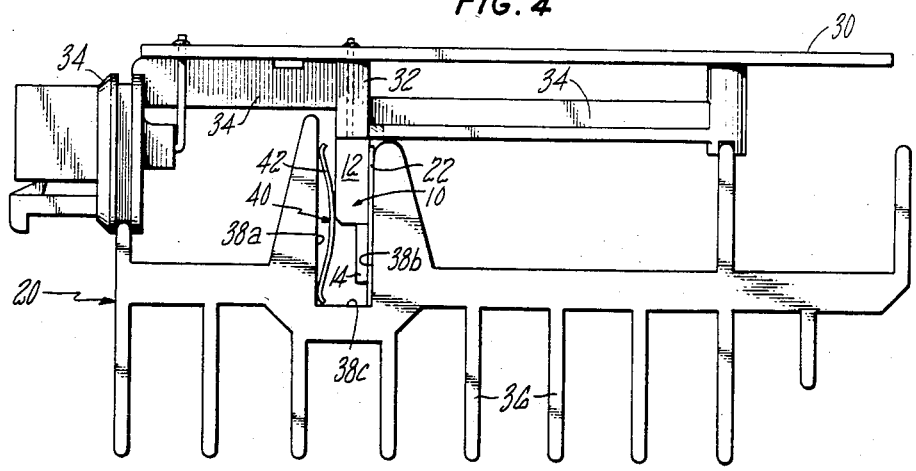
FIG. 4 is an end view of the heat sink and transistor mounting arrangement of the invention following assembly.

FIG. 4 illustrates the transistors 10 in assembled relation with the heat sink 20 using the mounting arrangement of the invention. To assemble, the insulating mica strip 22 is coated on both sides with thermal grease to facilitate heat transfer. In the event an insulator 22 is not required, the thermal grease may be applied directly to either the transistor tab 14 or the wall 38b of the channel 38. The spring assembly 40 is then disposed in the channel 38 with the spine 44 either innermost (as shown) or outermost in the channel and with the mid knee portions extending toward the center of the channel. The packaged transistors 10, having been preassembled to circuit board 30 are then inserted into the channel 38 between the spring assembly 40 and the insulator 22. The convex shape of the individual spring beams 42 provides a ramped surface for facilitating the insertion of the transistors. As the transistor 10 are pushed into the channel 38 toward its rear wall 38c, the ramp of the spring beams 42 compresses those springs between the body of the transistors 10 and the wall 38a of the channel. When the transistors 10 are pushed all the way into the channel 38, the body 12 of the packaged transistors 10 is engaged by the mid-portion or knee of the spring beams 42 and the transistors are urged into intimate engagement with the wall 38b of channel 38 via the greased insulator 22. It has been found that the compressive force of the spring beams 42 ensures good heat transfer relation between the transistors 10 and the heat sink 20 and that such heat transfer relationship is maintained over numerous and extreme cycles.

It will be noted that the length of at least one of the members forming the opposite walls 38a, 38b of the heat sink channel 38 is such that it engages part of the connector structure 34 before the tabs 14 of the transistor packages 10 reach the bottom wall 38c of the channel 38, thereby preventing electrically-conductive metal-to-metal contact between the tabs 14 and the heat sink 20. The assembled arrangement depicted in FIG. 4 affords not only retention of the transistors 10 in good heat transfer relation with the heat sink 20, but also allows those transistors to be simply removed for repair and/or replacement and reinstallation.

Although this invention has been shown and described with respect to detailed embodiments thereof, it will be understood by those skilled in the art that various changes in form and detail thereof may be made without departing from the spirit and scope of the claimed invention.

Having thus described a typical embodiment of my invention, that which is claimed as new and desired to secure by Letters Patent of the United States is:

1. Heat sink mounting arrangement for a semiconductor comprising:
   a heat sink having an elongated channel formed therein, said channel being defined by a pair of opposed side wall surfaces of said heat sink and being open at its front;
   a plurality of packaged semiconductors positioned within and disposed along said heat sink channel; and
   spring means comprising a plurality of spring beams connected in common along an end in comb-like fashion positioned in said heat sink channel and interposed between one of said pair of side wall surfaces and said semiconductors in mutually opposed compressive engagement therewith, each said spring beam being associated with only a respective single one of said semiconductors.

2. The heat sink mounting arrangement of claim 1 wherein each said packaged semiconductor includes a semiconductor packaged in an electrically non-conductive body and said body is affixed to a conductive metal base tab.

3. The heat sink mounting arrangement of claim 2 wherein said semiconductor package base tab is proximate the other of said pair of side wall surfaces of said heat sink channel and including a thin electrically insulating material disposed intermediate said other of said pair of side wall surfaces and said base tab.

4. The heat sink mounting arrangement of claim 1 wherein said packaged semiconductors are premounted to a circuit board.

5. The heat sink mounting arrangement of claim 1 wherein each of said spring beams is convexly shaped and is disposed such that, following positioning in said channel, it provides a ramp surface to guide entry of respective said semiconductors.

6. The heat sink mounting arrangement of claim 5 wherein each said spring beam is recurved at its opposite ends to facilitate flexure within said heat sink channel.

7. The heat sink mounting arrangement of claim 4 wherein said packaged semiconductors are each in a TO-220 package configuration.

8. Heat sink mounting arrangement for a semiconductor comprising:
   a heat sink having a channel formed therein, said channel being defined by a pair of opposed side wall surfaces of said heat sink and being open at its front;
   a packaged semiconductor positioned within said heat sink channel, said packaged semiconductor including a semiconductor packaged in an electrically non-conductive body and said body being affixed to a conductive metal base tab; and
   spring means positioned in said heat sink channel and being interposed between one of said pair of side wall surfaces and said semiconductor in mutually-opposed compressive engagement therewith, said spring means contacts said semiconductor package only at said non-conductive body thereof, each said semiconductor package base tab being proximate the other of said pair of said side wall surfaces of said heat sink channel, and further including a thin electrically insulating material disposed intermediate said other of said pair of side wall surfaces and said base tab.

9. The heat sink mounting arrangement of claim 8 wherein said spring means comprises at least one spring of generally convex shape having its opposite ends in engagement with one of said side wall surfaces of said heat sink and having its mid-region in engagement with the semiconductor package.

10. The heat sink mounting arrangement of claim 8 wherein said packaged semiconductor is in a TO-220 package configuration.

* * * * *